(12) United States Patent
Tanaka

(10) Patent No.: US 7,994,484 B2
(45) Date of Patent: Aug. 9, 2011

(54) STAGE APPARATUS AND EXPOSURE APPARATUS

(75) Inventor: Keiichi Tanaka, Saitama (JP)

(73) Assignee: Nikon Corporation, Tokyo (JP)

( * ) Notice: Subject to any disclaimer, the term of this patent is extended or adjusted under 35 U.S.C. 154(b) by 170 days.

(21) Appl. No.: 12/385,059

(22) Filed: Mar. 30, 2009

(65) Prior Publication Data

US 2009/0218511 A1    Sep. 3, 2009

Related U.S. Application Data

(63) Continuation of application No. PCT/JP2007/068647, filed on Sep. 26, 2007.

(30) Foreign Application Priority Data

Sep. 29, 2006  (JP) .................................. 2006-266315

(51) Int. Cl.
*G01N 31/00* (2006.01)
*A61N 5/00* (2006.01)

(52) U.S. Cl. .................. 250/453.11; 250/492.1; 355/75; 355/53

(58) Field of Classification Search ............. 250/453.11, 250/492.1; 355/53, 72, 75, 76
See application file for complete search history.

(56) References Cited

U.S. PATENT DOCUMENTS

| | | |
|---|---|---|
| 6,445,440 B1 | 9/2002 | Bisschops et al. |
| 6,950,176 B1 | 9/2005 | LaFontaine et al. |
| 7,391,498 B2 * | 6/2008 | Hayashi .......................... 355/53 |
| 7,489,389 B2 * | 2/2009 | Shibazaki ...................... 355/75 |
| 2002/0159042 A1 | 10/2002 | Poon |
| 2003/0201606 A1 | 10/2003 | Shinozaki |
| 2004/0094722 A1 | 5/2004 | Bisschops et al. |
| 2005/0093502 A1 | 5/2005 | Poon et al. |

FOREIGN PATENT DOCUMENTS

| | | |
|---|---|---|
| EP | 1 052 550 A2 | 11/2000 |
| EP | 1 052 551 A2 | 11/2000 |
| EP | 1 310 828 A1 | 5/2003 |

(Continued)

OTHER PUBLICATIONS

Dec. 25, 2007 International Search Report for PCT/JP2007/068647 (with translation).
Dec. 25, 2007 Written Opinion of the International Searching Authority for PCT/JP2007/068647 (with translation).
Mar. 2, 2011 Supplementary European Search Report issued in European Patent Application No. 07828420.5.

*Primary Examiner* — Bernard E Souw
(74) *Attorney, Agent, or Firm* — Oliff & Berridge, PLC

(57) ABSTRACT

The present invention provides a stage apparatus wherein an object is disposed in an atmosphere with a gas pressure lower than atmospheric pressure, and the object can be driven with high accuracy. The stage apparatus that drives a reticle comprises: a vacuum chamber, which forms a space and has an opening; an integrated coarse and fine motion table, which has an electrostatic chuck that holds the object, that, when driven, moves the electrostatic chuck inside the space; a counter mass, which is disposed so that it covers the opening, that is capable of moving because of the reaction force produced when the integrated coarse and fine motion table is driven; and a vacuum cover, which forms a space that houses the counter mass; wherein the space and the space are set to prescribed gas pressures.

10 Claims, 3 Drawing Sheets

FOREIGN PATENT DOCUMENTS

| | | |
|---|---|---|
| EP | 1 350 997 A2 | 10/2003 |
| JP | A-2000-331930 | 11/2000 |
| JP | A-2003-31491 | 1/2003 |
| JP | A-2003-229472 | 8/2003 |
| JP | A-2004-95797 | 3/2004 |
| JP | A-2004-260161 | 9/2004 |

* cited by examiner

STAGE APPARATUS AND EXPOSURE APPARATUS

CROSS-REFERENCE TO RELATED APPLICATION

This is a Continuation Application of International Application No. PCT/JP2007/068647, filed Sep. 26, 2007, which claims priority to Japanese Patent Application No. 2006-266315, filed Sep. 29, 2006. The contents of the aforementioned applications are incorporated herein by reference.

FIELD OF THE INVENTION

The present invention relates to a stage apparatus that drives an object, an exposure apparatus that comprises the stage apparatus, and a device fabricating method wherein the exposure apparatus is used.

DESCRIPTION OF RELATED ART

In an exposure apparatus that uses a charged particle beam or extreme ultraviolet light (hereinbelow, called EUV light) with a wavelength of, for example, approximately 100 nm as an exposure beam to expose a substrate, such as a wafer, via a mask, exposures are generally performed in a vacuum with a gas pressure that is lower than atmospheric pressure in order to prevent the exposure beam from being absorbed by gases. Consequently, various types of exposure apparatuses are equipped with a vacuum chamber that maintains a vacuum atmosphere; furthermore, in order to drive a mask, a substrate, or the like with good accuracy, stage apparatuses, parts of which are exposed to an atmosphere at atmospheric pressure, are disposed inside the vacuum chamber (for example, refer to Japanese Patent Application Publication No. 2004-260161A).

Exposing part of the stage apparatus of a conventional exposure apparatus that uses a charged particle beam or EUV light as the exposure beam to the atmospheric pressure atmosphere poses the risk that the pressure differential between the atmospheric pressure and the vacuum will be applied to one or more constituent members of the stage apparatus. In these types of exposure apparatuses, the pressure differential is considerably large because of the large degree of vacuum in the atmosphere wherethrough the exposure beam passes, and there is a risk that the large pressure differential will deform those constituent members.

In addition, given that atmospheric pressure is constantly acting upon the outer surface of the vacuum chamber of the exposure apparatus and moreover that the vacuum chamber itself is quite large, the resultant internal/external pressure differential constitutes another huge force that is constantly acting on the vacuum chamber. Consequently, there is a risk that the pressure differential will deform part of the vacuum chamber. Furthermore, there is also a risk that if the atmospheric pressure fluctuates, then the amount of deformation of the vacuum chamber and the constituent members of the stage apparatus will vary.

Essentially, when part of the vacuum chamber or any of the constituent members of the stage apparatus were to deform, controlling the stage apparatus with high accuracy becomes difficult. In particular, in a stage apparatus that is partially exposed to the atmospheric pressure atmosphere, part of the vacuum chamber is used as a guide surface of a movable member; consequently, if the pressure differential were to deform that guide surface, its guiding accuracy might decrease, which, in turn, might cause a decline in the positioning accuracy of the mask, the substrate, or the like.

A purpose of some aspects of the present invention is to provide a stage apparatus that can drive an object to be driven with high accuracy even in a case wherein the object is disposed in an atmosphere with a gas pressure that is lower than atmospheric pressure.

Another purpose is to provide an exposure apparatus and a device fabricating method wherein that stage apparatus is used.

SUMMARY

The stage apparatus according to the present invention is a stage apparatus that drives an object and comprises: a first member that forms a first space and that has an opening formed in at least part thereof; a table that has a holding part, which holds the object, and that is configured so that, when driven, the holding part moves inside the first space; a movable member, which is disposed so that it covers the opening, that is capable of moving because of the reaction force produced when the table is driven; and a second member, which is used to form a second space that houses the movable member; wherein, the gas pressure of the first space and the gas pressure of the second space can be set to prescribed values with respect to the gas pressure of a space external to the first space and the second space.

According to the present invention, the movable member is capable of moving because of the reaction force produced when the table that holds the object is driven; vibration is thereby reduced when the object is driven. Furthermore, the gas pressure of the first space, wherein the holding part of the table that holds the object is disposed, and the gas pressure of the second space, which houses the movable member that is capable of moving because of the reaction force produced when the table is driven, can be set separately. Consequently, the gas pressures of the first space, the second space, and the space at atmospheric pressure on the outer side of the second member can be set so that, for example, they have increasingly higher pressures from each other, in this order. Accordingly, the gas pressure differential applied to the constituent members of the stage apparatus and/or the first member that partitions the first space can be reduced than if the second space were not provided. Furthermore, that gas pressure differential can be maintained substantially constant even if the atmospheric pressure fluctuates. Accordingly, the amount of deformation of the constituent members of the stage apparatus decreases, and the object to be driven can be driven with high accuracy.

DESCRIPTION OF EMBODIMENTS

First Embodiment

Figure 1:
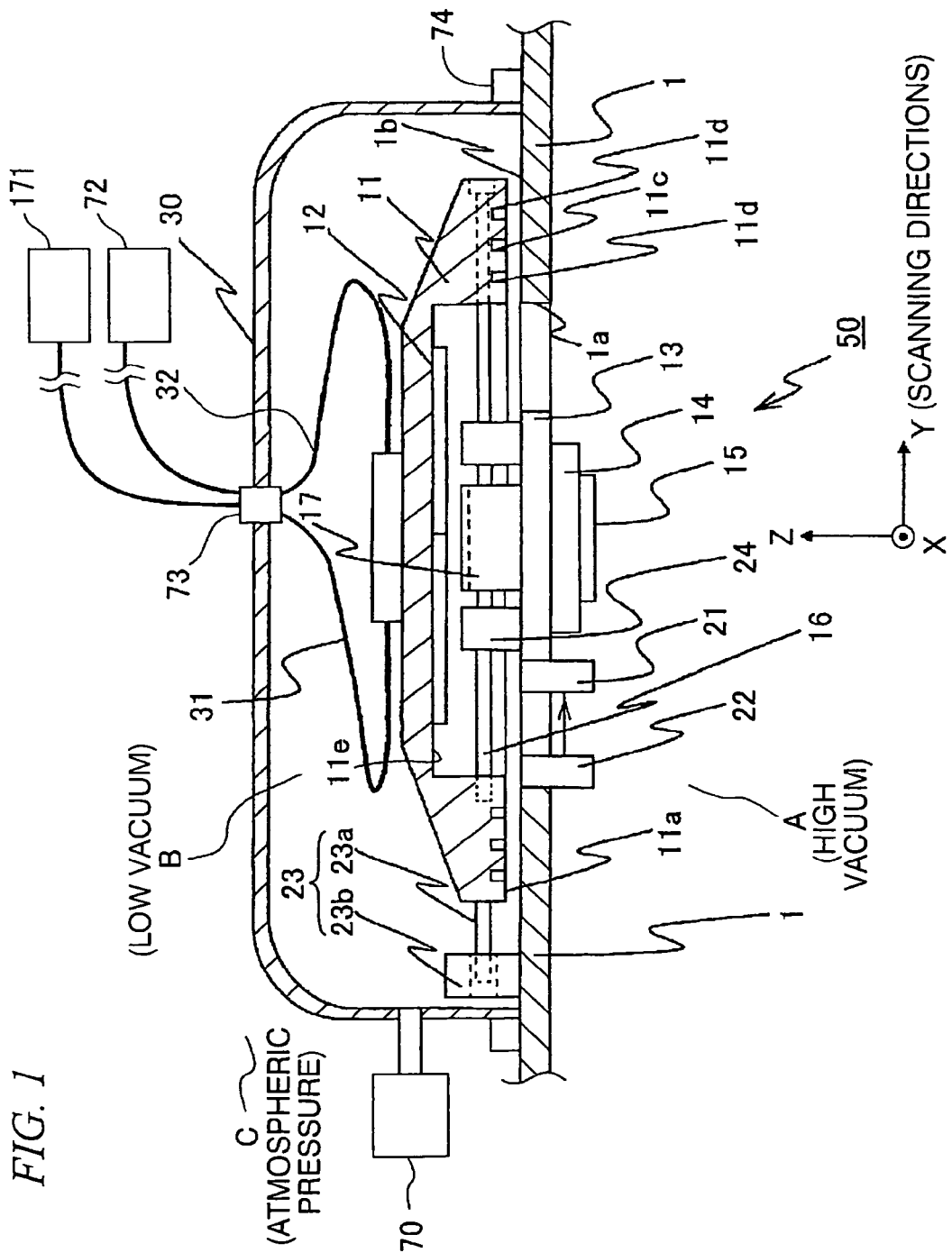
FIG. 1 is a cross sectional view that shows the configuration of a stage apparatus according to a first embodiment of the present invention.

FIG. 1 shows a stage apparatus 50 according to a first embodiment of the present invention. In an exposure apparatus that uses, for example, a charged particle beam or EUV light as an exposure beam, the stage apparatus 50 is used to hold and drive a reticle 15 (mask). In the following explanation, the Z axis in FIG. 1 is perpendicular to a guide surface (which corresponds to a slide surface 1b of a vacuum chamber 1 discussed below; in the present embodiment, a substantially horizontal surface) for driving the reticle 15 (further, the −Z direction is vertically downward), the X axis is perpendicular to the paper surface in FIG. 1 within that guide surface, and the Y axis is parallel to the paper surface in FIG. 1. The exposure apparatus that comprises the stage apparatus 50 of the present embodiment is a scanning exposure type exposure apparatus that exposes the wafer by synchronously driving a reticle and a wafer (a substrate or a sensitive substrate), which is coated with a resist (photosensitive material), in prescribed scanning directions, and those scanning directions are directions (Y directions) parallel to the Y axis in FIG. 1. In addition, FIG. 1 is a cross sectional view taken along a plane that is parallel to a ZY plane and that passes substantially through the center of the stage apparatus 50.

FIG. 1 shows part of a vacuum chamber 1 that provides a vacuum atmosphere and covers a space (in the present embodiment, a space A wherein the reticle 15 is disposed) that includes the optical path of the exposure beam of the exposure apparatus. The space A inside the vacuum chamber 1 is a region wherein a gas pressure of approximately $10^{-6}$ torr is maintained by a vacuum pump 107 (refer to FIG. 2). The vacuum chamber 1 is made of a relatively thin steel plate, and ribs (not shown) are installed at locations requiring greater strength. An opening 1a is formed in the upper surface of the vacuum chamber 1. Part of an integrated coarse and fine motion table 13 of the stage apparatus 50 is installed in the space A via the opening 1a. The integrated coarse and fine motion table 13 is discussed below. The opening 1a is of sufficient size, and therefore there is no mechanical interference between the integrated coarse and fine motion table 13 and the opening 1a even if the integrated coarse and fine motion table 13 is scanned in the Y directions or moved in the X directions. For example, when defining characteristics like the size and shape of the opening 1a, those characteristics should be defined based on the exposure shape and on the region over which the integrated coarse and fine motion table 13 moves attendant with the exposure. The slide surface 1b that is used by a counter mass 11 (discussed below) is provided to an outer surface of the upper surface of the vacuum chamber 1. The slide surface 1b is provided so that it forms a frame shaped region that surrounds the opening 1a and is finished to a prescribed planarity (high degree of planarity).

The stage apparatus 50 comprises: the integrated coarse and fine motion table 13, which comprises an electrostatic chuck 14; the counter mass 11, which is capable of moving in response to the reaction force that is produced when the integrated coarse and fine motion table 13 is driven; and a box shaped vacuum cover 30 that houses the counter mass 11 in a space (a space B), which is enclosed by the vacuum cover 30 and the upper surface of the vacuum chamber 1. The electrostatic chuck 14 is a part that chucks the reticle 15 so that an incident surface and a reflecting surface of exposure light face vertically downward (in the −Z direction). The integrated coarse and fine motion table 13 serves to move the reticle 15 with good accuracy in the vacuum atmosphere. The integrated coarse and fine motion table 13 is configured so that a holding surface of the electrostatic chuck 14 and the reticle 15 held thereby are disposed inside the space A. The counter mass 11 is provided in order to offset the reaction force produced when the integrated coarse and fine motion table 13 is driven and is configured so that, based on the law of conservation of momentum, it can move in a direction opposite that of the movement of the integrated coarse and fine motion table 13. A recessed part 11e, the size of which is substantially the same as the opening 1a, is formed in a lower surface center part of the counter mass 11. The mass of the counter mass 11 may be set appropriately; however, increasing the mass to, for example, ten fold that of the integrated coarse and fine motion table 13 makes it possible to reduce the stroke traveled by the counter mass 11 when it is moved.

A Y direction linear motor slider 17 is provided to the upper surface of the integrated coarse and fine motion table 13. In addition, a rod shaped Y direction linear motor stator 16 that is thin and long in the Y directions is fixed to the counter mass 11 so that it traverses the recessed part 11e in the Y directions. The Y direction linear motor stator 16 and the Y direction linear motor slider 17 constitute a Y axis linear motor that noncontactually drives the integrated coarse and fine motion table 13 in the Y directions. The linear motor employs, for example, a moving magnet type linear motor, but the present invention is not limited thereto and a moving coil type linear motor may be used.

When driving the Y direction linear motor stator 16 generates thrust and the Y direction linear motor slider 17 is moved in a prescribed direction, the integrated coarse and fine motion table 13 moves in the same direction inside the space A. The reaction force produced at that time acts on the Y direction linear motor stator 16. The Y direction linear motor stator 16 is connected to the counter mass 11, and these elements therefore move integrally in a direction opposite that of the integrated coarse and fine motion table 13 by a stroke in accordance with the mass ratio of the Y direction linear motor stator 16 and the counter mass 11 to the integrated coarse and fine motion table 13. Thus, the reaction force produced by the Y direction linear motor stator 16 when the integrated coarse and fine motion table 13 is driven is offset by the drive of the Y direction linear motor stator 16 and the counter mass 11. As a result, it is possible to prevent the transmission of, for example, the reaction force to the Y direction linear motor stator 16 and the vacuum chamber 1 and thereby prevent the adverse impact of vibration thereof.

A slide surface 11a is formed in an outer circumferential part of the counter mass 11 so that it surrounds the recessed part 11e in the lower surface center part of the counter mass 11. The slide surface 11a of the counter mass 11 is disposed so that it opposes the slide surface 1b of the vacuum chamber 1. An air bearing (fluid bearing) is formed between the slide surface 11a of the counter mass 11 and the slide surface 1b of the vacuum chamber 1. A plurality of air pads 11c, which levitate the counter mass 11 by jetting a gas toward the slide surface 1b of the vacuum chamber 1, and a plurality of differential pumping grooves 11d, which recover the jetted gas, are disposed in the slide surface 11a of the counter mass 11. The plurality of the air pads 11c and the differential pumping grooves 11d are disposed in a full circle on the slide surface 11a so that they surround the opening 1a of the vacuum chamber 1.

Furthermore, jetting the gas out from the air pads 11c onto the slide surface 1b and exhausting that gas via the differential pumping grooves 11d makes it possible to smoothly move the counter mass 11 above the slide surface 1b in the X directions and the Y directions, and around the Z axis in a noncontactual state. Furthermore, it is possible to make the structure gastight so that virtually no gas flows between the space A inside the vacuum chamber 1 and the space B enclosed by the vacuum chamber 1, the counter mass 11, and the vacuum cover 30. Furthermore, because the positional relationship between the counter mass 11 and the vacuum chamber 1 changes attendant with the movement of the counter mass 11, the positional relationship between the slide surface 1b and the slide surface 11a also changes. Consequently, the size of the slide surface 1b of the vacuum chamber 1 is set beforehand by taking the movement region of the counter mass 11 (the slide surface 11a) into consideration. To reduce the size of the slide surface 1b, the mass ratio of the counter mass 11 to the integrated coarse and fine motion table 13 should be increased (namely, the counter mass 11 should be made heavier), and the movement region of the counter mass 11 should be reduced. In addition, at this point, the counter mass 11 functions as a partition that makes the space A and the space B independent of one another. Accordingly, the vacuum chamber 1 and the counter mass 11 as well as the air bearing formed thereby (including the slide surface 1b and the slide surface 11a) form at least part of a sealing apparatus that serves to make the space A and the space B independent of one another. Furthermore, the vacuum cover 30 and the like are additionally needed to form the space B, but this is explained later. Electromagnetic cores 12 are disposed on the upper surface of the recessed part 11e of the counter mass 11. Each electromagnetic core 12 is configured so that a coil is wound around a core member, and thereby a large magnetic field can be generated by flowing an electric current to the coil (as in what can be called a type of electromagnet). As a rule, numerous electromagnetic cores 12 are arrayed in the recessed part 11e of the counter mass 11 so that they cover the range of motion of the integrated coarse and fine motion table 13.

A magnetic body (e.g., iron piece) 24 is disposed on the upper surface of the integrated coarse and fine motion table 13. The interaction between the magnetic body 24 and the electromagnetic cores 12, which are disposed in the counter mass 11, makes it possible to leave a small gap between the magnetic body 24 and the electromagnetic cores 12 at a prescribed position midair, thereby preventing the integrated coarse and fine motion table 13 from contacting the counter mass 11. The electromagnetic cores 12 and the magnetic body 24 constitute a Z and leveling mechanism for the reticle 15.

Furthermore, selectively exciting the electromagnetic cores 12 enables the integrated coarse and fine motion table 13 to pivot around the X axis and the Y axis (the θX directions and the θY directions). In addition, the integrated coarse and fine motion table 13 can be moved in the Z directions by exciting all of the electromagnetic cores 12. Accordingly, the excitation of the electromagnetic cores 12 makes it possible to move the integrated coarse and fine motion table 13 with respect to the counter mass 11 in directions of three degrees of freedom (Z, θX, and θY) in a noncontactual state.

The integrated coarse and fine motion table 13 is configured so that it moves non-contactually with respect to the counter mass 11 (including the Y direction linear motor stator 16 and the electromagnetic cores 12); therefore, the integrated coarse and fine motion table 13 may be provided in advance, with, for example, a stopper so that it does not drop in the −Z direction when the excitation of the electromagnetic cores 12 is stopped.

Furthermore, as one example, when the counter mass 11 and the integrated coarse and fine motion table 13 are to be assembled, the portion wherein the magnetic body 24 and the Y direction linear motor slider 17 of the integrated coarse and fine motion table 13 are fixed is disposed inside the recessed part 11e of the counter mass 11 in the state wherein the Y direction linear motor stator 16 is pulled out from the counter mass 11 in the rightward direction. In this state, the Y direction linear motor stator 16 is inserted from the right side so that it traverses the recessed part 11e and, for example, a flange part of the Y direction linear motor stator 16 should be fixed to a right side surface of the counter mass 11 using a bolt (not shown).

In addition, to detect the position of the integrated coarse and fine motion table 13 accurately in the Y directions a Y direction laser interferometer 22 is installed in the vicinity of the opening 1a of the vacuum chamber 1. Moreover, a Y direction movable mirror 21 (which may be substituted by the reflecting surface of the end part of the integrated coarse and fine motion table 13) is fixed to one end of the integrated coarse and fine motion table 13. Laser light from the Y direction laser interferometer 22 is radiated to the Y direction movable mirror 21 of the integrated coarse and fine motion table 13, and the position of the integrated coarse and fine motion table 13 is measured with high accuracy using, for example, a reference mirror (not shown) as a reference.

A trim motor stator 23b is fixed to the outer surface of the vacuum chamber 1 to the side of the counter mass 11, and a trim motor slider 23a is fixed to the counter mass 11 so that it opposes the trim motor stator 23b. The trim motor slider 23a and the trim motor stator 23b constitute a Y direction trim motor 23, such as a voice coil motor, for adjusting the position of the counter mass 11 with respect to the vacuum chamber 1 in the Y directions. For example, if the position of the counter mass 11 gradually shifts to the +Y direction or the −Y direction when the integrated coarse and fine motion table 13 is driven in the Y directions, then the Y direction trim motor 23 can adjust the position of the counter mass 11 in the Y directions as needed.

The vacuum cover 30 is fixed to the outer surface of the vacuum chamber 1 via a sealing material 74 so that it covers the counter mass 11. The interior of the vacuum cover 30 is exhausted by a vacuum pump 70 and the space B between the counter mass 11 and the vacuum cover 30 is a region wherein the gas pressure is set to a range of approximately $10^{-4}$-10 torr. This is because the space B is not a space wherethrough the exposure beam passes, and therefore it is not necessary to reduce the gas pressure therein to the level set in the space A (namely, to set it to a high degree of vacuum). In addition, a space C on the outer side of the vacuum cover 30 is set to a gas pressure of substantially 760 torr, the same as atmospheric pressure.

Furthermore, the explanation of the present specification treats the gas pressure (degree of vacuum) set in the space A as high vacuum, and the gas pressure (degree of vacuum) set in the space B as low vacuum. The difference between the high vacuum and the low vacuum is relative, and therefore the gas pressure of the high vacuum region should be set lower (to a higher degree of vacuum) than the gas pressure of the low vacuum region. Furthermore, as discussed below, the gas pressure (degree of vacuum) of the space A and the space B may be set to the same value. By adopting a configuration as described above, the space B in the present embodiment is spaced apart from the space A by part of the vacuum chamber 1 and by the counter mass 11 and the air bearing. In addition, the space B is spaced apart from the space C by the vacuum cover 30 and the sealing material 74. Furthermore, the space A and the space C are spaced apart by the vacuum chamber 1.

In addition, the members that are connected to and supply action force to the counter mass 11 are connected thereto only in the space B. In this case, the action force is not limited to that required to drive the counter mass 11. Specifically, a wiring 32—which is for supplying electric power to the electromagnetic cores 12 and the Y direction linear motor stator 16 disposed in the counter mass 11—and a piping group 31—which includes the piping for flowing coolant (e.g., cooling water) to cool the electromagnetic cores 12, piping from the differential pumping grooves 11d, and piping for supplying gas to the air pad 11c—are pulled into the low vacuum space B, which is covered by the vacuum cover 30 (discussed above). If the Y direction linear motor stator 16 has a coil and the like, then piping may be provided for flowing coolant to cool the coil. The wiring 32 and the piping group 31 are flexible and configured so that any tension applied to the counter mass 11 is small. Furthermore, the piping group 31 and the wiring 32 are provided to an upper part of the vacuum cover 30, pass through an opening that is hermetically sealed by a sealing material 73, and communicate with a fluid control unit 171 and a motor drive part 72, respectively.

Generally, wiring and piping in a vacuum outgas, and the released gases form contaminants inside the exposure apparatus and produce various adverse effects. Nonetheless, in the present embodiment, the low vacuum space B, which is covered by the vacuum cover 30, has no direct relationship with the exposure, and consequently the gas released from the piping group 31 and the wiring 32 does not form contaminants inside the exposure apparatus—even if the piping group 31 and the wiring 32 are pulled into the space B.

The above explanation discussed the stage apparatus 50, focusing on the Y direction drive mechanism and the operation thereof, however, the integrated coarse and fine motion table 13 can be driven accurately inside the opening 1a within a prescribed range even in the X directions. Because the stage apparatus 50 is used as a reticle stage, it is configured so that its stroke in the directions orthogonal to the scanning directions (X directions) is relatively smaller than its stroke in the scanning directions (Y directions). The present embodiment is configured so that the movement of the integrated coarse and fine motion table 13 in the Y directions is performed by the Y axis linear motor, as discussed above; however, the movement in the X directions is performed by a voice coil motor (VCM; not shown). The VCM has an X direction motor stator and an X direction motor slider. The X direction motor stator is fixed to the counter mass 11 so that it is perpendicular to the Y direction linear motor stator 16 and traverses the recessed part 11e in the X directions. Furthermore, the X direction motor slider, which is connected to the X direction motor stator and the integrated coarse and fine motion table 13, generates a thrust in the X directions, which moves the integrated coarse and fine motion table 13 in the X directions.

In addition, like the Y direction laser interferometer 22, an X direction laser interferometer (not shown) is installed in the vicinity of the opening 1a of the vacuum chamber 1 in order to detect the position of the integrated coarse and fine motion table 13 accurately in the X directions. Moreover, an X direction movable mirror (not shown) is fixed to one end of the integrated coarse and fine motion table 13. Laser light from the X direction laser interferometer is radiated to the X direction movable mirror of the integrated coarse and fine motion table 13, and the position of the integrated coarse and fine motion table 13 is measured with high accuracy using, for example, a reference mirror (not shown) as a reference. Furthermore, like the Y direction trim motor 23, an X direction trim motor (not shown) can adjust the position of the counter mass 11 in the X directions as needed. Thereby, the integrated coarse and fine motion table 13 can be driven accurately inside the opening 1a within a prescribed range even in the X directions.

The sequence of the operations performed by the stage apparatus 50 of the present embodiment discussed above will now be explained. In FIG. 1, when a wafer (not shown) is to be exposed with a pattern of the reticle 15, the reticle 15 is chucked by the integrated coarse and fine motion table 13 via the electrostatic chuck 14. If an exposure is to be performed by scanning the reticle 15 in the Y directions, then an electric current is flowed to the coil of the Y direction linear motor stator 16 via the wiring 32, and the integrated coarse and fine motion table 13 is moved in the Y directions integrally with the reticle 15. The Y direction laser interferometer 22 measures the position of the integrated coarse and fine motion table 13 in the Y directions. If the integrated coarse and fine motion table 13 is accelerated in the Y directions, then a reaction force is applied to the Y direction linear motor stator 16 in accordance with the mass and the acceleration of the integrated coarse and fine motion table 13. Because the Y direction linear motor stator 16 is engaged with the counter mass 11, that reaction force moves the counter mass 11 along the Y axis in a direction opposite that of the direction in which the integrated coarse and fine motion table 13 moves. Thereby, virtually no vibrations are generated when the integrated coarse and fine motion table 13 is driven in the Y directions, which makes it possible to transfer the pattern of the reticle 15 onto the wafer with high accuracy.

Figure 2:
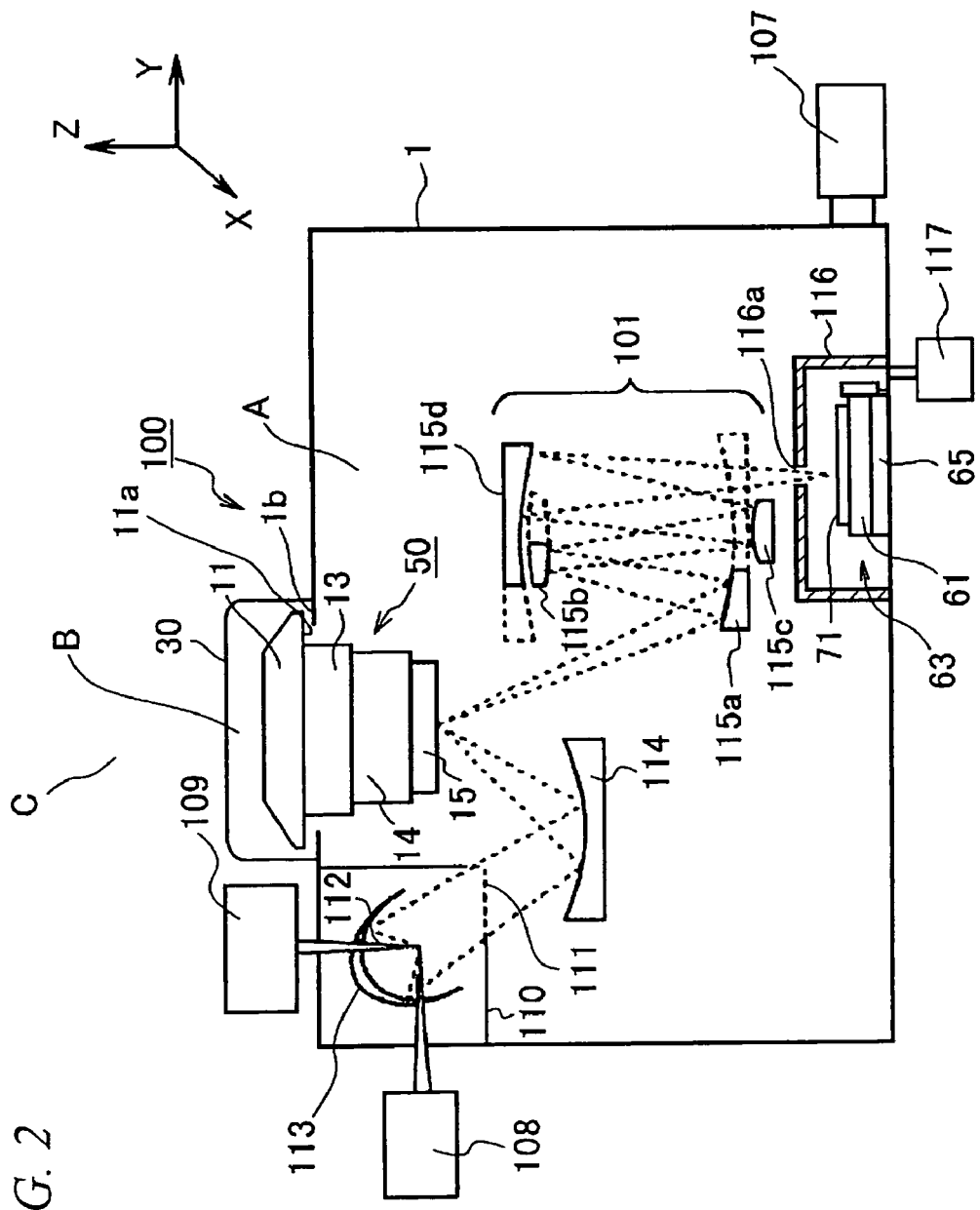
FIG. 2 is a partial cutaway view that shows a schematic configuration of an exposure apparatus according to a second embodiment of the present invention.

In addition, the space B between the counter mass 11 and the vacuum cover 30 is maintained as a low vacuum by the vacuum pump 70, and there is a small gas pressure differential between the space B and the space A inside the vacuum chamber 1, which is maintained as a high vacuum by the vacuum pump 107 (refer to FIG. 2). However, it can be said that this gas pressure differential is nominal in comparison with the atmospheric pressure. Consequently, there is virtually no load (stress) produced by the gas pressure differential applied to the counter mass 11; therefore, the counter mass 11 undergoes virtually no deformation. In addition, because the space B, which contacts the slide surface 1b of the vacuum chamber 1, is maintained as a low vacuum, there is virtually no gas pressure differential between the interior and exterior of the vacuum chamber 1 at the portion at which the stage apparatus 50 is installed, and therefore the vacuum chamber 1 undergoes virtually no deformation owing to the gas pressure differential.

In addition, the counter mass 11 is levitated by the air pads 11c above the slide surface 1b of the vacuum chamber 1 so that it is spaced apart therefrom by a gap of approximately several microns; however, because there is no deformation of the slide surface 11a of the counter mass 11 or the slide surface 1b of the vacuum chamber 1, the counter mass 11 can be moved easily by the reaction force of the integrated coarse and fine motion table 13 with the gap of several microns maintained as is. Consequently, nothing hinders the movement of the counter mass 11 and it is possible to drive the integrated coarse and fine motion table 13 with good accuracy.

The following describes the operation and effects of the present embodiment, and a modified example thereof.

(1) The stage apparatus 50 of the present embodiment is a stage apparatus that drives the reticle 15, and comprises: the vacuum chamber 1, which forms the space A with an opening 1a formed in at least part thereof; the integrated coarse and fine motion table 13 that has the electrostatic chuck 14, which holds the reticle 15, and is configured so that the electrostatic chuck 14 moves inside the space A when the integrated coarse and fine motion table 13 is driven; the counter mass 11, which is disposed so that it covers the opening 1a and is capable of moving by the reaction force produced when the integrated coarse and fine motion table 13 is driven; and the vacuum cover 30, which is for forming the space B that houses the counter mass 11; in addition, the gas pressure of the space A and the gas pressure of the space B can be set to prescribed values in relation to the gas pressure of the space C, which is external to the space A and the space B.

In this case, the counter mass 11 moves owing to the reaction force produced when the integrated coarse and fine motion table 13 (the reticle 15) is moved, which reduces vibration when the reticle 15 is driven. As a result, it is possible to drive the reticle 15 at a high speed without reducing exposure accuracy, which makes it possible to improve the throughput of the exposing process.

Furthermore, as one example, the gas pressures of the space A, wherein the electrostatic chuck 14 of the integrated coarse and fine motion table 13, which holds the reticle 15 is disposed, the space B, which is formed between the counter mass 11 and the vacuum cover 30, and the space C, which is on the outer side of the vacuum cover 30 and is at atmospheric pressure, are set so that they gradually increase in this order. Accordingly, the gas pressure differential applied to the vacuum chamber 1, which partitions the constituent members of the stage apparatus 50 and/or the space A, decreases more than would be the case if the vacuum cover 30 (the space B) were not provided, and therefore the amount of deformation of the constituent members of the stage apparatus 50 and/or the vacuum chamber 1 also decreases.

In addition, even if the atmospheric pressure inside the space C fluctuates, the gas pressure differential between the space B and the space A is maintained so that it is substantially constant, and consequently the amount of deformation of the constituent members of the stage apparatus 50 and/or the vacuum chamber 1 does not fluctuate. Accordingly, the reticle 15 can always be driven with high accuracy.

(2) In addition, the gas pressure of the space B is set to a low vacuum in a range of substantially $1 \times 10^{-4}$-10 torr. Nevertheless, the gas pressure of the space B is not limited to that range. However, if the upper limit of the gas pressure of the space B increases, then the gas pressure differential between the space B and the space A increases, which poses a risk that the amount of deformation of the counter mass 11 and/or the vacuum chamber 1 will increase. Moreover, the gas pressure of the space B may fall below its lower limit. For example, there is a possibility that the gas pressure of the space A and the space B will become the same. In this case, it is preferable that the gas pressure differential between the space A and the space B is small; however, in that event, the mechanism needed to maintain the gas pressure of the space B becomes complicated.

Furthermore, the gas pressure of the space A, wherein the reticle 15 is disposed, is maintained at a high vacuum of substantially $10^{-6}$ torr. In the present embodiment, the range of the gas pressure of the space A should be maintained such that the transmittance of the exposure beam is not greatly attenuated.

(3) Furthermore, the gas pressure of the space B may be set lower than the gas pressure of the space C on the outer side thereof (here, atmospheric pressure) and higher than the gas pressure of the space A; however, the pressure value does not have to be specified. Here, too, the gas pressure differential between the space A and the space B is smaller than the gas pressure differential between the space A and the atmospheric pressure, and consequently the amount of deformation of the constituent members of the stage apparatus 50 and/or the vacuum chamber 1 decreases.

(4) In addition, in the stage apparatus 50 of FIG. 1, the vacuum chamber 1 and the counter mass 11 form at least part of the sealing apparatus that makes the space A and the space B independent of one another. Thus, the counter mass 11 also serves as the partition (part of the sealing apparatus) between the space A and the space B, and thereby makes it possible to partition the space A and the space B with a simple configuration.

(5) In this case, the sealing apparatus has a differential pumping type air bearing (bearing) that is formed between the vacuum chamber 1 and the counter mass 11; furthermore, the air bearing includes the slide surface 1b (first surface), which is formed around the opening 1a of the vacuum chamber 1, and the slide surface 11a (second surface), which is provided to the counter mass 11 so that it opposes the slide surface 1b. Thereby, it is possible to divide the space A and the space B with a simple configuration.

Furthermore, the counter mass 11 may be supported by the slide surface 1b of the vacuum chamber 1 via a magnetic fluid bearing (bearing). Thereby, it is possible to move the counter mass 11 smoothly with respect to the vacuum chamber 1 while improving the gastightness between the space A and the space B.

(6) In addition, the piping group 31 and the wiring 32, which are connected to and serve to supply action force to the counter mass 11, are connected thereto only in the space B. In this case, because the space B and the space A, wherein the reticle 15 is disposed, are substantially isolated from one another, gas that is released from the piping group 31 and the wiring 32 does not leak out to the space A, wherein the reticle 15 is disposed, and therefore does not adversely affect the optical system (not shown) inside the space A.

(7) In addition, the integrated coarse and fine motion table 13 is driven non-contactually with respect to the counter mass 11. Accordingly, the position and the velocity of the reticle 15, which is held by the integrated coarse and fine motion table 13, can be controlled with high accuracy.

In this case, the Z and leveling mechanism (support mechanism), which comprises the electromagnetic cores 12 and the magnetic body 24, is also provided in order to support the integrated coarse and fine motion table 13 noncontactually by the counter mass 11. Accordingly, when a scanning exposure is performed with, for example, an autofocus system, it is possible to control, for example, the position of the integrated coarse and fine motion table 13 (the reticle 15) in the Z directions.

Furthermore, a configuration may be adopted wherein the integrated coarse and fine motion table 13 is divided into, for example, a coarse motion table and a fine motion table.

(8) In addition, in the first embodiment of FIG. 1, the guide surface (the slide surface 1b) for the counter mass 11 is formed integrally with the vacuum chamber 1, and therefore the configuration is simplified. Nevertheless, it is also acceptable to fix a guide member with a high degree of planarity to, for example, the outer surface of the vacuum chamber 1 and to use the upper surface of that guide member (a separate member) as the guide surface of the counter mass 11.

Second Embodiment

A second embodiment of the present invention will now be explained, referencing FIG. 2. In the present embodiment, the stage apparatus 50 of FIG. 1 is adapted to an exposure apparatus (EUV exposure apparatus) 100, which uses EUV light as the exposure beam. Members in FIG. 2 that are identical to those in FIG. 1 are assigned the identical symbols, and therefore detailed explanations thereof are omitted. In the present embodiment, it is preferable to use light with a wavelength in the range of 1-50 nm as the EUV light.

In FIG. 2, the exposure apparatus 100 comprises: the vacuum chamber 1, which has a large box shape and covers the optical path of the EUV light (the exposure beam); a laser plasma X-ray source, which generates EUV light; an illumination system, which illuminates the reflecting type reticle 15 with the EUV light; the stage apparatus 50 (reticle stage system), which is the same as that of the embodiment shown in FIG. 1 and holds and moves the reticle 15; an image optical system 101 (projection system), which uses the EUV light reflected by the reticle 15 to form a reduced image of the pattern of the reticle 15 on the wafer 71; and a stage apparatus (wafer stage system), which holds and moves the wafer 71. In FIG. 2, as in FIG. 1, the Z axis is perpendicular to the guide surface (which corresponds to the slide surface 1b of the vacuum chamber 1 and is a substantially horizontal surface) that is used when the reticle 15 is driven, and the X axis and the Y axis (scanning directions) are two orthogonal directions within the guide surface.

In FIG. 2, the reflecting type reticle 15 is loaded into and unloaded out of the vacuum chamber 1 by a transport robot (not shown). The loaded reticle 15 is held below (vertically downward in the −Z direction) the integrated coarse and fine motion table 13 of the stage apparatus 50 via the electrostatic chuck 14. The integrated coarse and fine motion table 13 drives the reticle 15 in the X directions and the Y directions, and in the rotational directions around the Z axis, and the electromagnetic cores (the electromagnetic cores 12 in FIG. 1) of the counter mass 11 drive the reticle 15 in the Z directions and in the rotational directions around the X axis and the Y axis.

The vacuum cover 30 covers the counter mass 11 of the stage apparatus 50, and the space B between the vacuum cover 30 and the counter mass 11 is maintained at a low vacuum in a range of substantially $1 \times 10^{-4}$-10 torr. Moreover, because the transmittance of the EUV light (exposure beam) is low in relation to the atmosphere, the space A inside the vacuum chamber 1 that includes the optical path wherethrough the EUV light passes is maintained at a high vacuum of substantially $1 \times 10^{-6}$ torr by the appropriate vacuum pump 107.

In FIG. 2, the EUV light is generated by the laser plasma X-ray source. The laser plasma X-ray source comprises a laser source 108 (excitation light source), and a xenon gas supply apparatus 109, which emits xenon gas (the target gas) from a nozzle 112. A small vacuum chamber 110 covers a light emitting part of the laser plasma X-ray source. The EUV light generated by the laser plasma X-ray source is condensed by a parabolic mirror 113.

The parabolic mirror 113 comprises a condenser optical system, and is disposed so that the xenon gas from the nozzle 112 reaches a focal point position in the vicinity of the position at which the xenon gas is discharged. The EUV light is reflected by a multilayer film of the parabolic mirror 113 and reaches a condenser mirror 114 through a window 111 of the vacuum chamber 110. The condenser mirror 114 reflects and condenses the EUV light onto the reflecting type reticle 15. The EUV light illuminates a prescribed portion (an arcuate illumination area) of the reticle 15. Namely, the parabolic mirror 113 and the condenser mirror 114 constitute an illumination system.

An absorbent pattern layer is formed on the pattern surface of the reticle 15 in order to form the pattern and multilayer film that reflect the EUV light. The EUV light is patterned by its reflection off of the reticle 15. The patterned EUV light reaches the wafer 71 via the image optical system 101.

The image optical system 101 of the present embodiment comprises four reflecting mirrors: a concave first mirror 115a, a convex second mirror 115b, a convex third mirror 115c, and a concave fourth mirror 115d. A multilayer film that reflects the EUV light is formed on each of the mirrors 115a-115d.

The EUV light reflected by the reticle 15 is sequentially reflected by the first through fourth mirrors 115a-115d, and thereby a reticle 15 pattern image, reduced by a reduction magnification of, for example, ¼, ⅕, or ⅙, reaches the wafer 71. The image optical system 101 is imagewise telecentric (on the wafer 71 side). Furthermore, the number and the arrangement of the mirrors that constitute the image optical system 101 are arbitrary.

In addition, the wafer 71 is chucked on a table 65 of a wafer stage 63 via an electrostatic chuck 61. Based on the measurement result of a laser interferometer (not shown), the wafer stage 63 moves the wafer 71 in the Y directions at a constant velocity and steps the wafer 71 in the X directions and the Y directions. More preferably, the wafer stage 63 also positions the wafer 71 in the Z directions and the rotational directions around the Z axis.

When one die (shot region) on the wafer 71 is to be exposed, the EUV light is radiated from the illumination system to the illumination area of the reticle 15, and the reticle 15 and the wafer 71 are synchronously moved (synchronously scanned) in the Y directions with respect to the image optical system 101 at a prescribed velocity ratio in accordance with the reduction magnification of the image optical system 101. At this time, the counter mass 11 in the stage apparatus 50 that holds the reticle 15 is driven in a direction opposite that of the integrated coarse and fine motion table 13, which reduces vibration that attends the scanning of the integrated coarse and fine motion table 13. Thereby, one die on the wafer 71 is exposed with the reticle pattern. The wafer 71 is subsequently stepped by driving the wafer stage 63, and a scanning exposure is then performed to expose the next die on the wafer 71 with the pattern of the reticle 15. Thus, a step-and-scan type method is used to successively expose the plurality of dies on the wafer 71 with the pattern of the reticle 15.

When an exposure is performed, it is preferable that the wafer 71 be disposed inside a partition 116 so that gas released from the resist on the wafer 71 does not adversely affect the mirrors 115a-115d of the image optical system 101. An opening 116a is formed in the partition 116, and the EUV light reflected by the mirror 115d of the image optical system 101 is radiated onto the wafer 71 through the opening 116a. The space inside the partition 116 is evacuated by a vacuum pump 117. Thus, gaseous foreign matter generated by the radiation of the EUV light onto the resist on the wafer 71 is prevented from adhering to the reticle 15 or the mirrors 115a-115d of the image optical system 101. The optical performance of these elements is thereby prevented from deteriorating.

The operation and effects of the present embodiment are as follows.

(1) The exposure apparatus 100 in FIG. 2 of the present embodiment is an exposure apparatus that exposes the wafer 71 with the EUV light via the reticle 15, and provided with the stage apparatus 50 of FIG. 1 in order to drive the reticle 15.

In this case, in FIG. 2, because the vacuum cover 30 is disposed above the counter mass 11 of the stage apparatus 50, there is virtually no gas pressure differential between the interior and the exterior of the counter mass 11, which serves double duty as a vacuum partition; moreover, that gas pressure differential does not fluctuate, even with fluctuations in the atmospheric pressure, and this reduces deformation owing to the gas pressure differential of the counter mass 11. In addition, the gas pressure differential between the interior and the exterior of the slide surface 1b of the vacuum chamber 1 is likewise small and constant, which reduces deformation that results from the differential pressure. Accordingly, the gap between the slide surface 1b of the vacuum chamber 1 and the slide surface 11a of the counter mass 11 does not fluctuate as a result of any gas pressure differential, and this enables the stable movement of the counter mass 11. Consequently, the movement of the integrated coarse and fine motion table 13 also becomes smooth and the reticle 15 can therefore be driven with high accuracy.

(2) In addition, in the exposure apparatus 100 of FIG. 2, the integrated coarse and fine motion table 13 of the stage apparatus 50 is scanned along a substantially horizontal surface, and the counter mass 11 moves along the slide surface 1*b* (guide surface) of the vacuum chamber 1, which is substantially parallel to the horizontal surface vertically below it.

Accordingly, the integrated coarse and fine motion table 13 and the counter mass 11 can be moved smoothly, and the reticle 15 can be driven with even higher accuracy.

Figure 3:
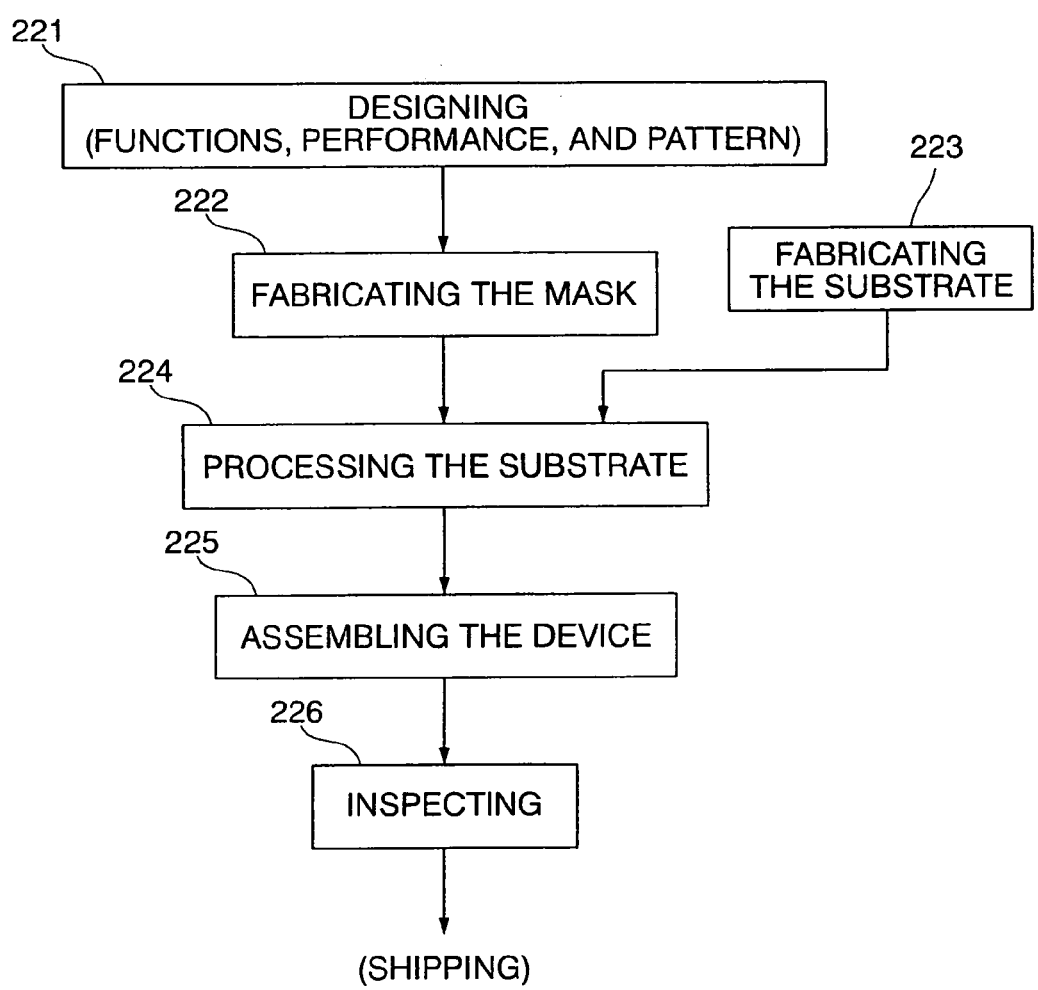
FIG. 3 is a flow chart that depicts one example of a device fabricating process.

In addition, when an electronic device (or a microdevice), such as a semiconductor device, is fabricated using the exposure apparatus according to the abovementioned embodiments, the device is fabricated as shown in FIG. 3 by, for example, the following steps: a step 221 that designs the functions and performance of the electronic device; a step 222 that fabricates a mask (reticle) based on the designing step; a step 223 that fabricates a substrate (wafer), which is the base material of the device, and coats such with a resist; a substrate processing step 224 that includes, for example, a process that uses the exposure apparatus (EUV exposure apparatus) according to the embodiments discussed above to expose the substrate (sensitive substrate) with the pattern of the mask, a process that develops the exposed substrate, and a process that heats (cures) and etches the developed substrate; a device assembling step 225 (comprising fabrication processes, such as a dicing process, a bonding process, and a packaging process); and an inspecting step 226.

In other words, the device fabricating method includes the steps of exposing the wafer (substrate) using the exposure apparatus according to the abovementioned embodiment, and developing the exposed wafer. At this time, according to the exposure apparatus of the abovementioned embodiment, the reticle can be driven with high accuracy, which furthermore makes it possible to manufacture high performance electronic devices with high accuracy.

The above explained the present invention based on the embodiments discussed above, but the technical scope of the present invention is not limited to those embodiments and may encompass, for example, the following types of modes.

(1) In the embodiment discussed above, a laser plasma X-ray light source is used as the exposure light source, but the present invention is not limited thereto; for example, a synchrotron orbital radiation (SOR) ring, a betatron light source, a discharge light source, an X-ray laser, or the like may be used.

(2) The embodiment discussed above explained a case wherein the stage apparatus 50 of FIG. 1 is adapted to the EUV exposure apparatus, but the energy beam that transfers the pattern is not particularly limited and may be, for example, visible light, ultraviolet light, X-rays (soft X-rays and the like), or a charged particle beam (an electron beam or an ion beam).

(3) In the embodiment discussed above, the stage apparatus 50 is adapted to a stage apparatus for driving the reticle, but it is acceptable to adapt it to a stage apparatus for driving the wafer. In addition, the reticle and the wafer may each be driven by a stage apparatus that is the same as that of the embodiment in FIG. 1.

(4) In the embodiment discussed above, the stage apparatus 50 is attached to the upper surface of the vacuum chamber 1 in FIG. 2, but the stage apparatus 50 may be attached to a side surface or the lower surface of the vacuum chamber 1. For example, if the stage apparatus 50 drives the wafer, then it may be attached to the lower surface of the vacuum chamber 1.

In addition, the exposure apparatus 100 (EUV exposure apparatus) in the abovementioned embodiment is manufactured by assembling various subsystems, including each constituent element of the stage apparatus 50 and the like recited in the claims of the present application, so that a prescribed mechanical accuracy, electrical accuracy, and optical accuracy are maintained. To ensure these various accuracies, adjustments are performed before and after this assembly, including an adjustment to achieve optical accuracy for the various optical systems, an adjustment to achieve mechanical accuracy for the various mechanical systems, and an adjustment to achieve electrical accuracy for the various electrical systems. The process of assembling the exposure apparatus from the various subsystems includes, for example, the mechanical interconnection of the various subsystems, the wiring and connection of electrical circuits, and the piping and connection of the atmospheric pressure circuit. Naturally, prior to performing the process of assembling the exposure apparatus from these various subsystems, there are also the processes of assembling each individual subsystem. When the process of assembling the exposure apparatus from the various subsystems is complete, a comprehensive adjustment is performed to ensure the various accuracies of the exposure apparatus as a whole. Furthermore, it is preferable to manufacture the exposure apparatus in a clean room, wherein the temperature, the cleanliness level, and the like are controlled.

The invention claimed is:

1. A stage apparatus that drives an object, comprising:
   a first member that forms a first space and that has an opening formed in at least part thereof;
   a table that has a holding part, which holds the object, and that is configured so that, when driven, the holding part moves inside the first space;
   a movable member, which is disposed so as to cover the opening, that is capable of moving because of the reaction force produced when the table is driven; and
   a second member, which is used to form a second space that houses the movable member;
   wherein,
   the gas pressure of the first space and the gas pressure of the second space can be set to prescribed values with respect to the gas pressure of a space external to the first space and the second space.

2. A stage apparatus according to claim 1 wherein the gas pressure of the second space is set in the range of substantially $1 \times 10^{-4}$-10 torr.

3. A stage apparatus according to claim 1, wherein the gas pressure of the second space is set higher than the gas pressure of the first space and lower than atmospheric pressure.

4. A stage apparatus according to claim 1, wherein the first member and the movable member form at least part of a sealing apparatus, which is used to make the first space and the second space independent of one another.

5. A stage apparatus according to claim 4, wherein the sealing apparatus has a bearing that is formed between the first member and the movable member; and
   the bearing comprises a first surface, which is formed around the opening of the first member, and a second surface, which is provided to the movable member so as to oppose the first surface.

6. A stage apparatus according to claim 1, wherein a member, which is connected to the movable member and used to supply action force thereto, is connected to the movable member only in the second space.

7. A stage apparatus according to claim 1, wherein the table is noncontactually driven with respect to the movable member.

8. An exposure apparatus that exposes a substrate with an exposure beam via a mask, comprising:

a stage apparatus according to claim 1 for driving at least one of the mask and the substrate.

9. An exposure apparatus according to claim 8, wherein the table of the stage apparatus is scanned along a substantially horizontal surface; and the movable member of the stage apparatus moves along a guide surface that is substantially parallel to the horizontal surface vertically below the movable member.

10. A device fabricating method, comprising:

exposing a substrate using an exposure apparatus according to claim 8; and developing the exposed substrate.

* * * * *